(12) United States Patent
Chen et al.

(10) Patent No.: US 7,198,705 B2
(45) Date of Patent: Apr. 3, 2007

(54) PLATING-RINSE-PLATING PROCESS FOR FABRICATING COPPER INTERCONNECTS

(75) Inventors: Linlin Chen, Plano, TX (US);
Jiong-Ping Lu, Richardson, TX (US);
Changfeng Xia, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/325,773

(22) Filed: Dec. 19, 2002

(65) Prior Publication Data

US 2004/0118692 A1 Jun. 24, 2004

(51) Int. Cl.
*C25D 5/48* (2006.01)
*C25D 7/12* (2006.01)
*C25D 5/02* (2006.01)
*C25D 5/10* (2006.01)

(52) U.S. Cl. .................. 205/220; 205/157; 205/123; 205/182

(58) Field of Classification Search ................ 205/157, 205/123, 220, 182
See application file for complete search history.

(56) References Cited

U.S. PATENT DOCUMENTS

| | | | |
|---|---|---|---|
| 6,194,366 B1* | 2/2001 | Naghshineh et al. | 510/175 |
| 6,197,181 B1* | 3/2001 | Chen | 205/123 |
| 6,423,200 B1* | 7/2002 | Hymes | 205/123 |
| 2001/0042689 A1* | 11/2001 | Chen | 205/108 |
| 2002/0090484 A1* | 7/2002 | Merricks et al. | 428/63 |
| 2003/0141194 A1* | 7/2003 | Chen | 205/123 |
| 2004/0000488 A1* | 1/2004 | Yang | 205/96 |
| 2004/0035708 A1* | 2/2004 | Chen et al. | 205/123 |
| 2004/0035710 A1* | 2/2004 | Chen et al. | 205/123 |
| 2004/0040857 A1* | 3/2004 | Chen et al. | 205/123 |
| 2004/0092065 A1* | 5/2004 | Chen et al. | 438/200 |

* cited by examiner

*Primary Examiner*—Edna Wong
(74) *Attorney, Agent, or Firm*—Jacqueline J. Garner; W. James Brady, III; Frederick J. Telecky, Jr.

(57) ABSTRACT

An improved copper ECD process. After the copper seed layer (116) is formed, a first portion of copper film (118) is plated onto the surface of the seed layer (116). The surface of the first portion of the copper film (118) is then rinsed to equalize the organic adsorption on all sites to prevent preferential copper growth in dense areas. After rinsing, the remaining copper of the copper film (118) is electrochemically deposited.

8 Claims, 2 Drawing Sheets

PLATING-RINSE-PLATING PROCESS FOR FABRICATING COPPER INTERCONNECTS

FIELD OF THE INVENTION

The invention is generally related to the field of forming copper interconnects in semiconductor devices and more specifically to electrochemical deposition of copper interconnects.

BACKGROUND OF THE INVENTION

Copper (Cu) metallization is gaining momentum in replacing aluminum (Al), particularly for the 0.18 um technology node and beyond. Due to the difficulty in dry etching Cu, a damascene approach is widely used for Cu metallization. This requires the Cu metallization process to have a high gap fill capability. The sputtering process widely used for Al metallization is not applicable to Cu metallization due to its inherent limitation in step coverage. Chemical vapor deposition (CVD) used in tungsten (W) metallization is not preferred for Cu at this time due to issues with morphology, adhesion and the conformal nature (seam formation issue) of CVD Cu films. Currently, the only manufacturable process for depositing Cu for interconnect applications is electrochemical deposition (ECD), thanks to its bottom-up fill capability.

Electrochemical deposition (ECD) is a process to produce solid phase product (such as thin films) by electrochemical reactions. Cu ECD is a process to make Cu thin film through electrochemical reduction of Cu ion, represented by the following electrochemical equation: $Cu^{++}+2e^{-}\rightarrow Cu$ where $e^{-}$ represents electron. In order for ECD process to proceed, a copper seed layer is required to pass current and to serve as a nucleation layer.

After ECD copper fill (overfill), chemical-mechanical polishing is used to remove excess copper. Unfortunately, copper protrusion 14 normally occurs in dense feature areas during ECD, as shown in FIG. 1. This is due to an accumulation of accelerating species on top of small features. The copper protrusion requires longer overpolish time and otherwise increases the difficultly of a CMP process. Longer overpolish time is one of the major factors for increased sheet resistance. As device features continue to shrink and density continues to increase, the protrusion problem becomes more and more significant.

SUMMARY OF THE INVENTION

The invention is an improved copper ECD process. After the copper seed layer is formed, copper is electrochemically deposited (ECD), or plated, to at least partially fill the small features. A rinse step is then performed. After the rinse step, the wafers are put back in the plating solution to continue depositing copper.

An advantage of the invention is providing an ECD process that provides a smooth film that is easier to CMP and provides better sheet resistance control.

This and other advantages will be apparent to those of ordinary skill in the art having reference to the specification in conjunction with the drawings.

DETAILED DESCRIPTION OF THE EMBODIMENTS

The invention will now be described in conjunction with dual damascene copper interconnect process. It will be apparent to those of ordinary skill in the art having reference to the specification that the benefits of the invention may be applied to ECD copper in general where it is desired to fill dense features.

Figure 2:
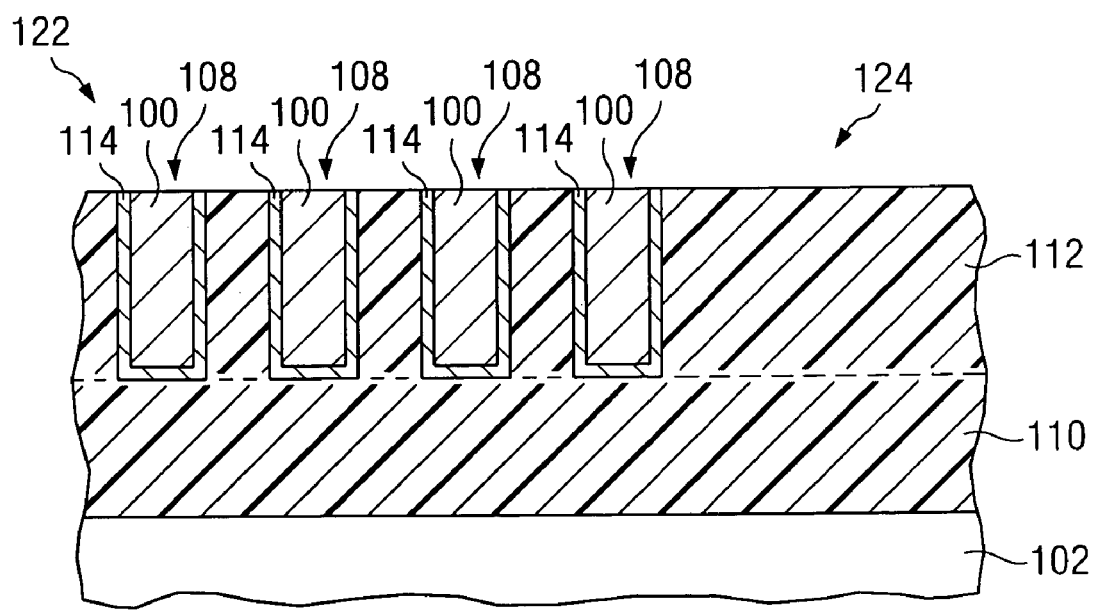
FIG. 2 is a cross-sectional diagram of a copper interconnect formed according to an embodiment of the invention.

A dual damascene copper interconnect 100 formed according to the invention is shown in FIG. 2. Copper interconnect 100 is formed over semiconductor body 102. Semiconductor body 102 typically has transistors and other devices (not shown) formed therein. Semiconductor body 102 may also include one or more additional metal interconnect layers (not shown). Copper interconnect 100 comprises a lead portion formed within trenches 108. A via portion (not shown) may also be formed below trenches 108. Vias extend from the bottom of trenches 108 through interlevel dielectric (ILD) 110 to a lower metal interconnect layer. Trenches 108 are formed within intrametal dielectric (IMD) 112. Various materials are known to be suitable for forming ILD 110 and IMD 112. For example, fluorine-doped silicate glass (FSG), organo-silicate glass (OSG), or other low-k or ultra low-k dielectrics may be used.

A barrier layer 114 is located between the copper interconnect 100 and the trench 108 (and via) sidewalls. Barrier layer 114 prevents copper from diffusing into the ILD 110 and IMD 112. Barrier layer 114 also provides adhesion between the copper and dielectric. Various barrier layers are known in the art. For example, refractory metals, refractory metal-nitrides, refractory metal-silicon-nitrides, or combinations thereof may be used.

Dense areas, such as area 122, contain closely spaced trenches. It is often difficult to balance processing requirements between the dense areas, 122, and the non-dense areas, 124. As discussed previously, prior art copper ECD processes typically form a protrusion over the dense areas. This requires a long overpolish during the CMP step to remove the protrusion. A long overpolish can increase the sheet resistance in the non-dense areas. The present invention reduces or eliminates the protrusion and thus, long overpolish time, by breaking the ECD into two steps and performing a rinse between the two ECD steps.

Figure 3A:
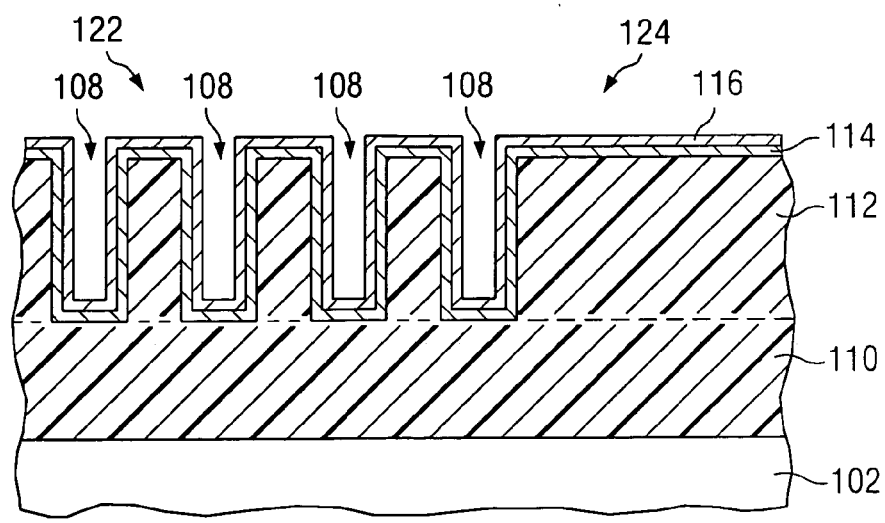
FIGS. 3A–3C are cross-sectional diagrams of the copper interconnect of FIG. 2 at various stages of fabrication.
Figure 3B:
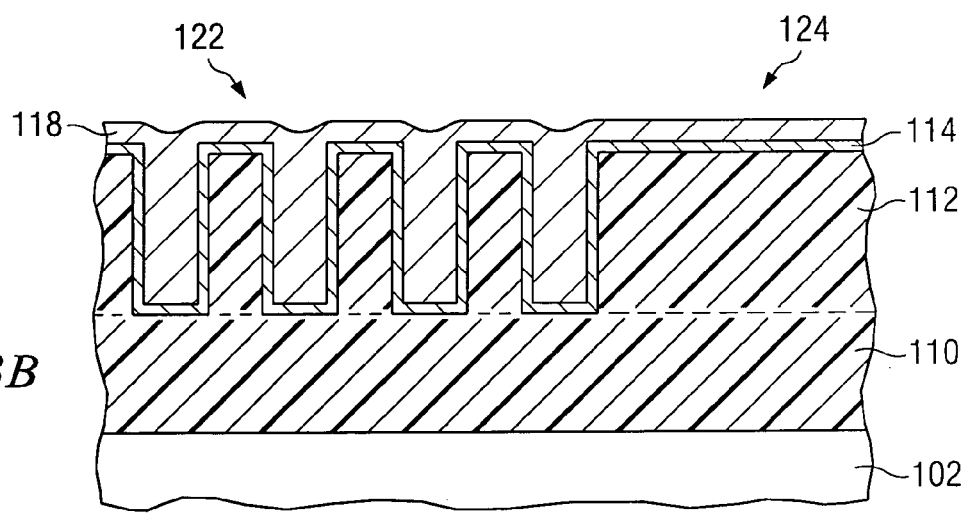
Figure 3C:
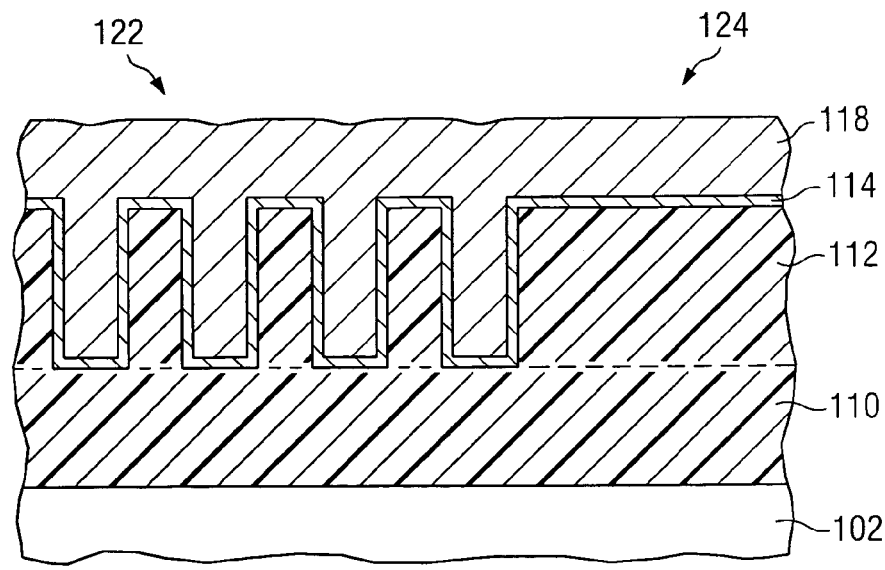

A method of fabricating copper interconnect 100 according to the invention will now be discussed with reference to FIGS. 3A–3C. Referring to FIG. 3A, semiconductor body 102 is processed through the formation of one or more metal interconnect layers. ILD 110 and IMD 112 are deposited over semiconductor body 102. Suitable materials, such as FSG or OSG, for ILD 110 and IMD 112 are known in the art. Trenches 108 are formed in IMD 112 and vias (not shown) are formed in ILD 110, using conventional processing.

Barrier layer 114 is formed over IMD 112 including within trenches 108. Barrier layer 114 functions as a diffusion barrier to prevent copper diffusion and as an adhesion layer. Transition metals and their nitrides are typically used for barriers. A transition metal-silicon nitride as well as combinations of transition metals, transition metal-nitrides and transition metal-silicon-nitrides may also be used.

Still referring to FIG. 3A, a copper seed layer 116 is deposited over barrier layer 114. Physical vapor deposition is traditionally used to form copper seed layer 116. The copper seed layer 116 is needed to pass current and to serve as a nucleation layer for the copper ECD process.

After deposition of the copper seed layer 116, the wafer is transferred to the ECD tool. In prior art ECD processes, a bump or protrusion occurs over dense features. The protrusion heights are a function of feature density and size. Higher protrusion is obtained with denser and smaller features. For example, 1–2 µm protrusion heights have been observed for 1 µm target plated copper. Copper residues that remain after CMP can cause shorts and affect yields and device reliability. Overpolish in order to clear areas with high protrusion can cause higher sheet resistance in other areas.

In order to eliminate or reduce protrusion over dense features, the invention uses a plating-rinse-plating process. In a preferred embodiment of the invention, the wafer is transferred to the plating cell of an ECD tool and a first plating process is conducted. Plating continues until the dense features are filled with copper film 118 as shown in FIG. 3B. The conditions of this first plating step are optimized to obtain a void-free fill of the dense features. The first plating step may include several plating currents. For example, the first plating step may include passing a current of approximately 0.75 Amps through the seed layer for a time on the order of 15 secs, increasing the current to around 3 Amps for approximately 30 seconds and then increasing the current to about 7.5 Amps until the dense features are filled or the desired fill height is reached.

After the dense features are filled, the wafer is removed from the plating solution, placed in a rinse chamber, and rinsed to remove or equalize the organic adsorption on all sites so preferential copper growth does not occur on top of the dense features. The preferred embodiment uses a multi-step rinse. First, the wafer is rinsed in a solution of ethanolamin, TMAH, and gallic acid. The rinse has a duration on the order of 3 minutes and is performed at 35–38° C. The pH of the solution is approximately 12. The purpose of this step is to remove adsorbed organic species from the copper surface. Second, the wafer is rinsed with a citric acid solution at room temperature to remove any copper oxide. Megasonic stirring is preferably incorporated. For example, either an immersion dip or a spin rinse may be used. If desired, this second step may be omitted. Third, the wafer is rinsed with de-ionized water (DIW). The DIW rinse removes contaminants left over from the first two steps. Finally, the wafer is dried using $N_2$.

Figure 1:
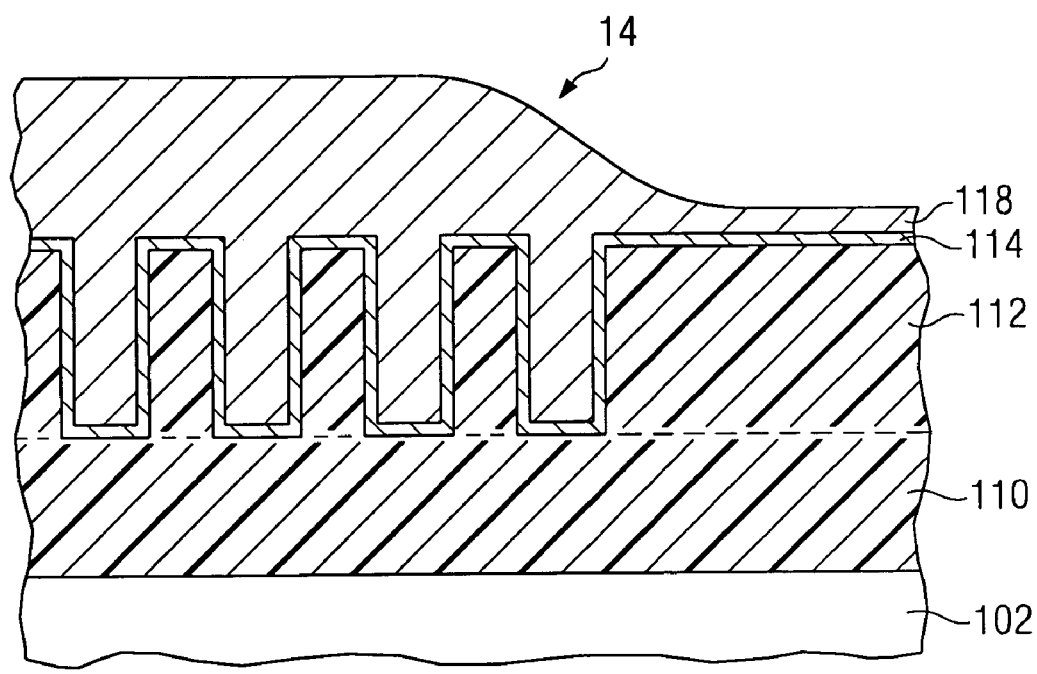
FIG. 1 is a cross-sectional diagram of a copper film deposited via a prior art ECD process.

After the rinse sequence, the wafer is returned to the plating solution to continue plating. Multiple cycles (plating-rinse-plating-rinse-plating . . . ) can be performed to achieve an optimal profile. The resulting copper film 118 is shown in FIG. 3C. Comparing FIG. 3C to FIG. 1, the copper film 118 formed according to the invention is more uniform and does not contain a significant protrusion over the dense features as in the prior art.

After the final copper thickness is achieved, a quick spin-rinse dry (SRD) is performed in the plating cell above the plating solution. The wafer is then transferred to the SRD cell and a post-ECD SRD is used to clean the plating residue. The resulting copper layer 118 is shown in FIG. 3C.

After the ECD process, the copper layer 118 (which incorporates seed layer 116) and barrier layer 114 are chemically-mechanically polished to form copper interconnect 100, as shown in FIG. 2. Because the protrusion over dense features has been reduced or eliminated, less overpolish is required for the CMP process to clear all the copper within dies of the wafer. As a result, lower sheet resistance is maintained across the wafer, particularly for features outside of dense areas. Processing may then continue to form additional metal interconnect layers and to package the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the benefits of the invention may be applied to forming the first metal interconnect layer. It is therefore intended that the appended claims encompass any such modifications or embodiments.

The invention claimed is:

1. A method of fabricating an integrated circuit, comprising the steps of:
   forming a copper seed layer over a semiconductor body;
   electrochemically depositing a first portion of a copper layer on said copper seed layer;
   rinsing a surface of the first portion of the copper layer; and
   electrochemically depositing a second portion of the copper layer;
   wherein said rinsing step comprises the steps of:
      rinsing said surface with deionized water;
      drying said surface;
      rinsing said surface with a first solution; and
      rinsing said surface with a citric acid solution after rinsing with said first solution and before rinsing with said deionized water.

2. The method of claim 1, wherein said first solution comprises ethanolamine, tetramethylammonium hydroxide (TMAH), and gallic acid and said first solution has a pH of approximately 12.

3. The method of claim 2, wherein said step of rinsing with a first solution occurs at a temperature in the range of 35–38° C.

4. The method of claim 1, wherein said step of rinsing with a citric acid solution occurs at room temperature.

5. A method of fabricating an integrated circuit, comprising the steps of:
   providing a semiconductor body having a dense area of trenches formed therein and a non-dense area;
   forming a copper seed layer over the semiconductor body including within the trenches;
   electrochemically depositing a first portion of a copper layer on said copper seed layer to fill said dense area of trenches;
   rinsing a surface of the first portion of the copper layer to equalize an organic adsorption on the surface of the copper layer between said dense area and said non-dense area; and
   electrochemically depositing a second portion of the copper layer;
   wherein said rinsing step comprises the steps of:
      rinsing said surface with a first solution;
      rinsing said surface with a citric acid solution;
      rinsing said surface with deionized water; and
      drying said surface.

6. The method of claim 5, wherein said first solution comprises ethanolamine, tetramethylammonium hydroxide (TMAH), and gallic acid and said first solution has a pH of approximately 12.

7. The method of claim 6, wherein said step of rinsing with a first solution occurs at a temperature in the range of 35–38° C.

8. The method of claim 5, wherein said step of rinsing said surface with a citric acid solution occurs at room temperature.

* * * * *